(12) United States Patent
Srinivasan

(10) Patent No.: US 7,123,012 B2
(45) Date of Patent: Oct. 17, 2006

(54) MULTIPLE TUNED RADIO FREQUENCY COIL FOR RESONANCE IMAGING AND SPECTROSCOPIC ANALYSIS

(75) Inventor: Ravi Srinivasan, Beachwood, OH (US)

(73) Assignee: Advanced Imaging Research, Inc., Cleveland, OH (US)

( * ) Notice: Subject to any disclaimer, the term of this patent is extended or adjusted under 35 U.S.C. 154(b) by 513 days.

(21) Appl. No.: 10/722,857

(22) Filed: Nov. 26, 2003

(65) Prior Publication Data

US 2004/0137872 A1 Jul. 15, 2004

Related U.S. Application Data

(60) Provisional application No. 60/429,909, filed on Nov. 29, 2002.

(51) Int. Cl.
*G01V 3/00* (2006.01)
(52) U.S. Cl. .................................... 324/318; 324/319
(58) Field of Classification Search .............. 324/318, 324/321, 309, 307, 322, 300; 600/410, 422; 128/653.5
See application file for complete search history.

(56) References Cited

U.S. PATENT DOCUMENTS

| | | | |
|---|---|---|---|
| 4,411,270 A | 10/1983 | Damadian | |
| 4,751,464 A | 6/1988 | Bridges | |
| 4,793,356 A | 12/1988 | Misic et al. | |
| 4,799,016 A | 1/1989 | Rezvani | |
| 4,845,431 A * | 7/1989 | Sullenberger | ............... 324/318 |
| 5,194,811 A | 3/1993 | Murphy-Boesch et al. | |
| 6,029,082 A * | 2/2000 | Srinivasan et al. | ......... 600/422 |
| 6,992,486 B1 * | 1/2006 | Srinivasan | .................. 324/318 |

\* cited by examiner

*Primary Examiner*—Brij B. Shrivastav
(74) *Attorney, Agent, or Firm*—Renner, Otto, Boisselle & Sklar, LLP (57) ABSTRACT

A multi-tune radio frequency (RF) coil for concurrent magnetic resonance imaging (MRI) and magnetic resonance spectroscopy (MRS) is disclosed. The multi-tune RF coil includes a first end ring having a generally annular opening and a first plurality of elongated segments coupled to and positioned circumferentially around the first end ring. The first plurality of elongated segments are azimuthally offset from one another by a substantially equal angular distance. A second RF coil includes a second end ring having a generally annular opening and a second plurality of elongated segments coupled to and positioned circumferentially around the second end ring. The second plurality of elongated segments are azimuthally offset from one another by a substantially equal angular distance. The first and second plurality of elongated segments are coupled to and positioned circumferentially around at least one of an a third end ring having a generally annular opening and an end cap, thereby forming a coil volume, and the first and second plurality of elongated segments lie in a same circumferential plane.

27 Claims, 10 Drawing Sheets

MULTIPLE TUNED RADIO FREQUENCY COIL FOR RESONANCE IMAGING AND SPECTROSCOPIC ANALYSIS

CROSS REFERENCE TO RELATED APPLICATIONS

This Application claims priority from U.S. Provisional Application Ser. No. 60/429,909 filed Nov. 29, 2002, which is incorporated herein by reference.

TECHNICAL FIELD

The present invention relates to magnetic resonance (MR) systems. Specifically, the invention relates to concurrent imaging and spectroscopy examination in a one patient setting. More specifically, the invention relates to a multiple tuned radio-frequency (RF) coil and method for use in such systems.

BACKGROUND

NMR or MRI

In Magnetic Resonance Imaging (MRI) systems and Nuclear Magnetic Resonance (NMR) systems, a static magnetic field (B) is applied to a body under investigation. The static magnetic field defines an equilibrium axis of magnetic alignment in a region of the body under investigation. An RF field is applied in the region being examined in a direction orthogonal to the static field direction. The RF field excites magnetic resonance in the region, and resulting RF signals are detected and processed. Generally, the resulting RF signals are detected by RF coil arrangements placed close to the body. See for example, U.S. Pat. No. 4,411,270 to Damadian and U.S. Pat. No. 4,793,356 to Misic et al. Typically, these coils are either surface type or volume type coils, and, depending on the application, are used to transmit RF and receive NMR signals from the region of interest (ROI).

Signals pertaining to different nuclei exhibiting ±½ spin can be observed using NMR. While proton ($^1$H) is used commonly for MRI, signals from other nuclei ($^{31}$P, $^{13}$C, $^{23}$Na, $^{19}$F, $^7$Li, etc.) are used to obtain bio-chemical and other information (e.g., functional, physiological, vascular etc.) from the object under investigation. The sensitivities of these nuclei, however, are much smaller than water protons. Hence coils with improved signal-to-noise ratio (S/N) are sought to improve the quality of the MR data obtained with these nuclei. Other techniques, such as proton decoupling and inverse experiments, are utilized to enhance the sensitivity of the NMR experiment. Thus, the dual tune coil chosen for the experiment must be capable of simultaneous operation. This should be done without sacrificing the performance of the low gamma nuclei.

Birdcage Coil

The birdcage coil is well known in the art (see, e.g., U.S. Pat. No. 4,672,705 issued to Hayes, the entire disclosure of which is incorporated by reference) and includes two end rings connected by several straight segments, which are referred to as legs. The birdcage coil has several resonance modes, of interest being the principal k=1 mode for homogeneous imaging. The principal mode has two linear modes oriented orthogonal to one another. The outputs from these modes can be combined using analog circuitry or digitally combined in a receiver system. The birdcage provides about a 41% improvement in S/N and expends about one-half of the power of conventional linear coils.

In addition, owing to the sinusoidal currents in the coil periphery, the birdcage provides a highly homogeneous B field in the transverse planes (XY) inside the coil, which is ideal for imaging whole-body, head, knee, wrist, etc. for adults. The B field profile along the coil axis, however, mimicks a gaussian distribution with maximum at the coil center.

The B field distribution can be improved over the adult head with an end-capped design of Hayes (see, e.g., Book of Abstracts, $5^{th}$ ISMRM, p39–40), which provides a more uniform B field distribution toward the top of the head. At the open end of the coil axis, the B field distribution for the end-capped coil design falls off like a conventional birdcage, which is ideal for imaging the adult head.

A dual-tuned birdcage (U.S. Pat. No. 4,799,016 issued to Rezvani et al.) used two birdcages in a lapped concentric fashion (one inside the other). Note, the low frequency birdcage coil located inside the high frequency birdcage coil will prevent flux from the outer high frequency birdcage coil from penetrating the dual-tuned coil's volume. The outer high frequency coil will be capacitive and let all of the flux from the low frequency coil pass through the dual-tuned coil's volume with little or no effect. Thus, the efficiency of the high frequency coil (proton coil) is reduced, which was seen by Fittzsimmons et al. (see e.g., Double Resonance Quadrature Birdcage, Mag Res Med, 1993, 30:107–114).

Likewise, if the low frequency coil is located outside the high frequency coil, flux from both coils penetrates the dual-tuned coil volume (over the imaging field of view [FOV]). But since the low frequency coil is located outside of the high frequency coil, the filling factor and hence the resultant S/N is low.

These effects prompt in favor of a design where the performance of a coil at the NMR frequencies can be maintained despite the dual frequency quadrature operation or despite the presence of a second coil near it.

A novel four-ring design was introduced in U.S. Pat. No. 5,194,811 issued to Murphy-Boesch et al., but here the FOV of the low gamma nucleus is much shorter than protons, which is undesirable if the coverage over the entire brain is sought.

A new design is solicited that will provide high signals and a high degree of RF homogeneity at both the NMR frequencies over the imaging FOV.

SUMMARY OF THE INVENTION

An object of the invention is to provide an RF coil with a high S/N and a high degree of RF homogeneity at multiple NMR frequencies that is capable of performing imaging and spectroscopy studies in one setting. Another object of the invention is to provide an RF coil capable of simultaneous use without compromising the performance of the low gamma nucleus.

According to one aspect of the invention, the invention is directed to a multi-tune radio frequency (RF) coil for concurrent magnetic resonance imaging (MRI) and magnetic resonance spectroscopy (MRS), including: a first RF coil, including a first end ring having a generally annular opening, and a first plurality of elongated segments coupled to and positioned circumferentially around the first end ring, wherein the first plurality of elongated segments are azimuthally offset from one another by a substantially equal angular distance; a second RF coil, including a second end ring having a generally annular opening, a second plurality of elongated segments coupled to and positioned circumferentially around the second end ring, wherein the second plurality of elongated segments are azimuthally offset from one another by a substantially equal angular distance; and at least one of a third end ring having a generally annular opening and an end cap, wherein the first and second plurality of elongated segments are coupled to and positioned circumferentially around the at least one of the end cap and the third end ring, thereby forming a coil volume, and the first and second plurality of elongated segments lie in a same circumferential plane.

Another aspect of the invention relates to a multi-tune radio frequency (RF) coil for concurrent magnetic resonance imaging (MRI) and magnetic resonance spectroscopy (MRS), including: a first RF coil, comprising: a first end ring having a generally annular opening; a second end ring having a generally annular opening; and a first plurality of elongated segments coupled to and positioned circumferentially around the first end ring and the second end ring, thereby forming a coil volume, wherein the first plurality of elongated segments are azimuthally offset from one another by a substantially equal angular distance; and a second RF coil, comprising: a third end ring having a generally annular opening; a fourth end ring having a generally annular opening; and a second plurality of elongated segments coupled to and positioned circumferentially around the third end ring and the fourth end ring, thereby forming a coil volume, wherein the second plurality of elongated segments are azimuthally offset from one another by a substantially equal angular distance, and wherein the first and second plurality of elongated segments lie in a same circumferential plane.

Yet another aspect of the invention relates to a system that includes the multi-tune coil; and further includes a means for driving the coil during magnetic resonance scanning.

Another aspect of the invention relates to a magnetic resonance scanning system, including a multi-tune coil; and means for processing RF signals which are at least one of received from the multi-tune coil and transmitted from the RF coil in order to obtain a magnetic resonance scan.

Yet another aspect of the invention relates to a multi-tune radio frequency (RF) coil, including: a first RF coil, which includes a first end ring having a generally annular opening, and a first plurality of elongated segments coupled to and positioned circumferentially around the first end ring, wherein the first plurality of elongated segments are azimuthally offset from one another by a substantially equal angular distance; a second RF coil, which includes a first cylinder formed by a second plurality of elongated, wherein the second plurality of elongated segments are azimuthally offset from one another by a substantially equal angular distance, and a second cylinder, wherein the first cylinder is within the second cylinder; and an end cap, wherein the first and second plurality of elongated segments are coupled to and positioned circumferentially around the end cap, thereby forming a coil volume, and the first and second plurality of elongated segments lie in a same circumferential plane.

Other aspects, features, and advantages of the invention will become apparent from the following detailed description. It should be understood, however, that the detailed description and specific examples, while indicating several embodiments of the present invention, are given by way of illustration only and various modifications may naturally be performed without deviating from the present invention.

BRIEF DESCRIPTION OF DRAWINGS

These and further features of the present invention will be apparent with reference to the following description and drawings, wherein.

DISCLOSURE OF INVENTION

Figure 1:
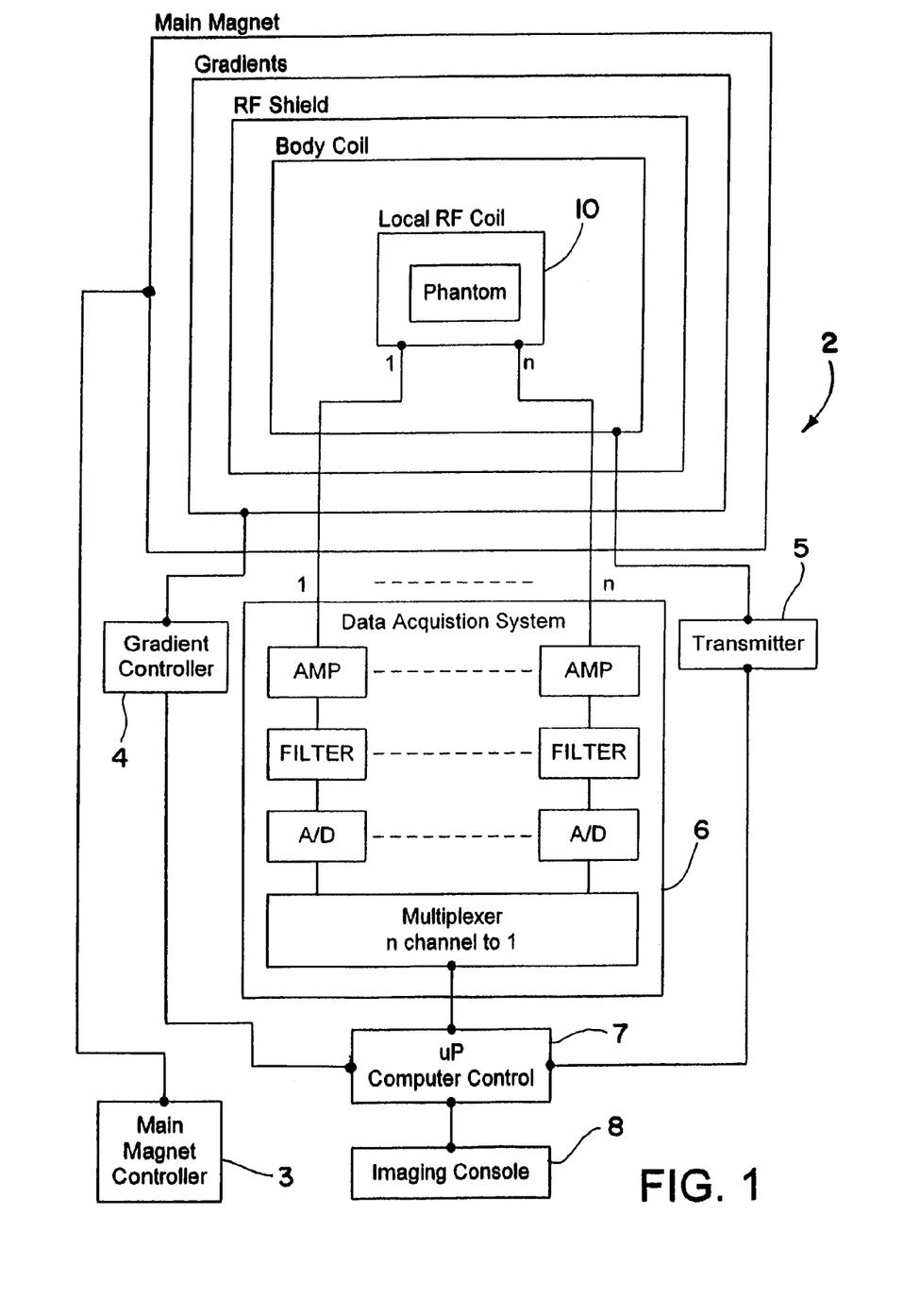
FIG. 1 is a block diagram of a system utilizing a coil in accordance with the present invention.

Referring to FIG. 1, a block diagram of an MR system 2 employing a coil in accordance with the present invention is illustrated. The system 2 includes a main magnet controller 3, a gradient controller 4, a transmitter 5 and a data acquisition system 6, as is conventional. A computer controller 7 controls the operation of the system, and system data is provided to a user through an imaging console 8. The coil 10 sends and receives data to/from the data acquisition system 6.

Figure 2:
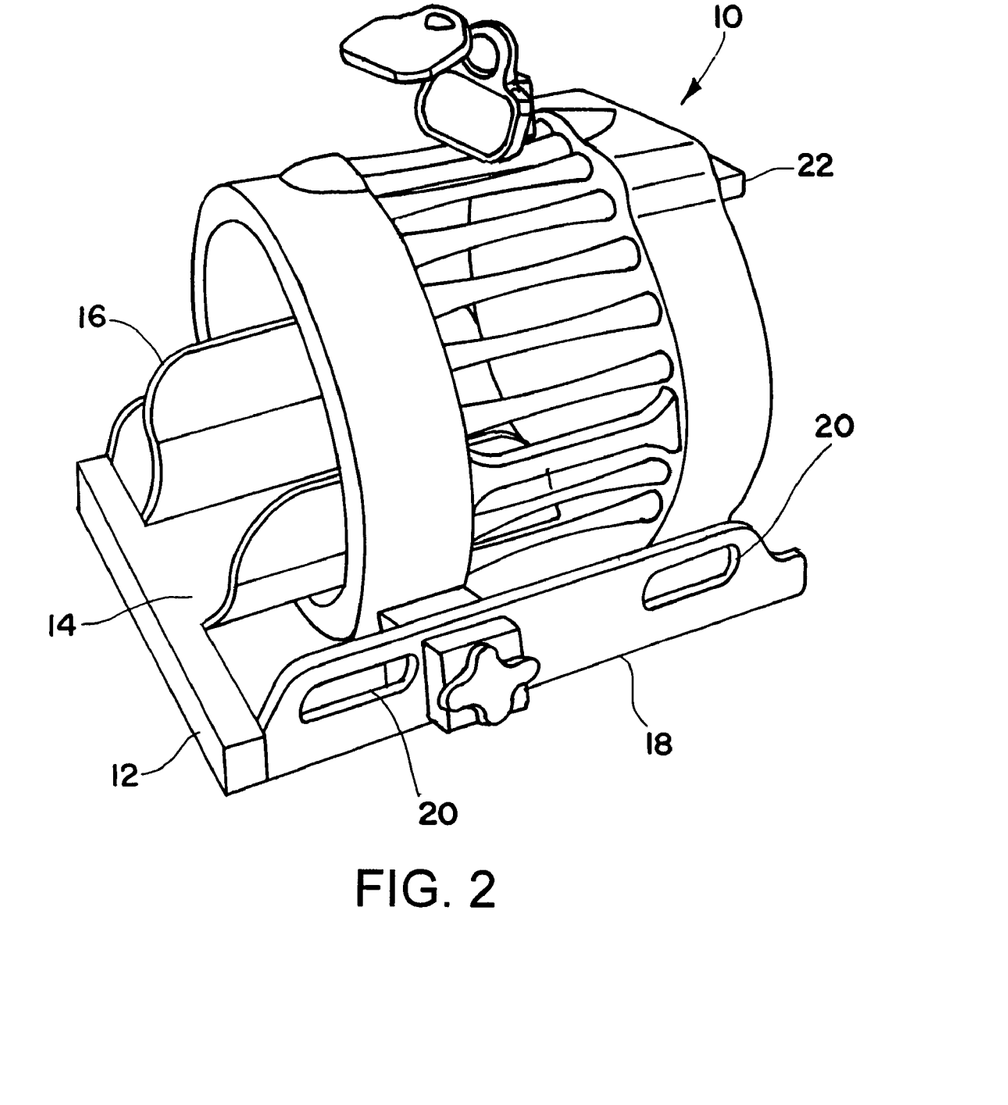
FIG. 2 is an isometric view of a dual-tune coil in accordance with an embodiment of the present invention.

Moving to FIG. 2, a rendering of a dual-tune coil 10 and base 12 is illustrated. The dual-tune coil is used for concurrent Magnetic Resonance imaging (MRI) and Magnetic Resonance Spectroscopy (MRS) of the human brain. The base 12 includes a bottom tray 14, a head rest 16 and rails 18 for guiding the coil 10 as it is moved relative to the base. Handles 20 are provided on either side (either front and rear or left and right) to transport the base 12 with the coil 10. The coil 10 has a handle 22 at the rear for grip and to help position it over the human brain and remove it after the MR study. The coil 10 is positioned over a base located closest to a magnet (not shown) of the MR system 2. The coil 10 is moved past the head rest 16 and the subject is laid down and held in place with the help of cushions and straps (not shown) for comfort, support and immobilization during the MR scan. The coil 10 then is placed over the patient and the entire assembly is sent in a magnet isocenter (not shown).

Figure 3:
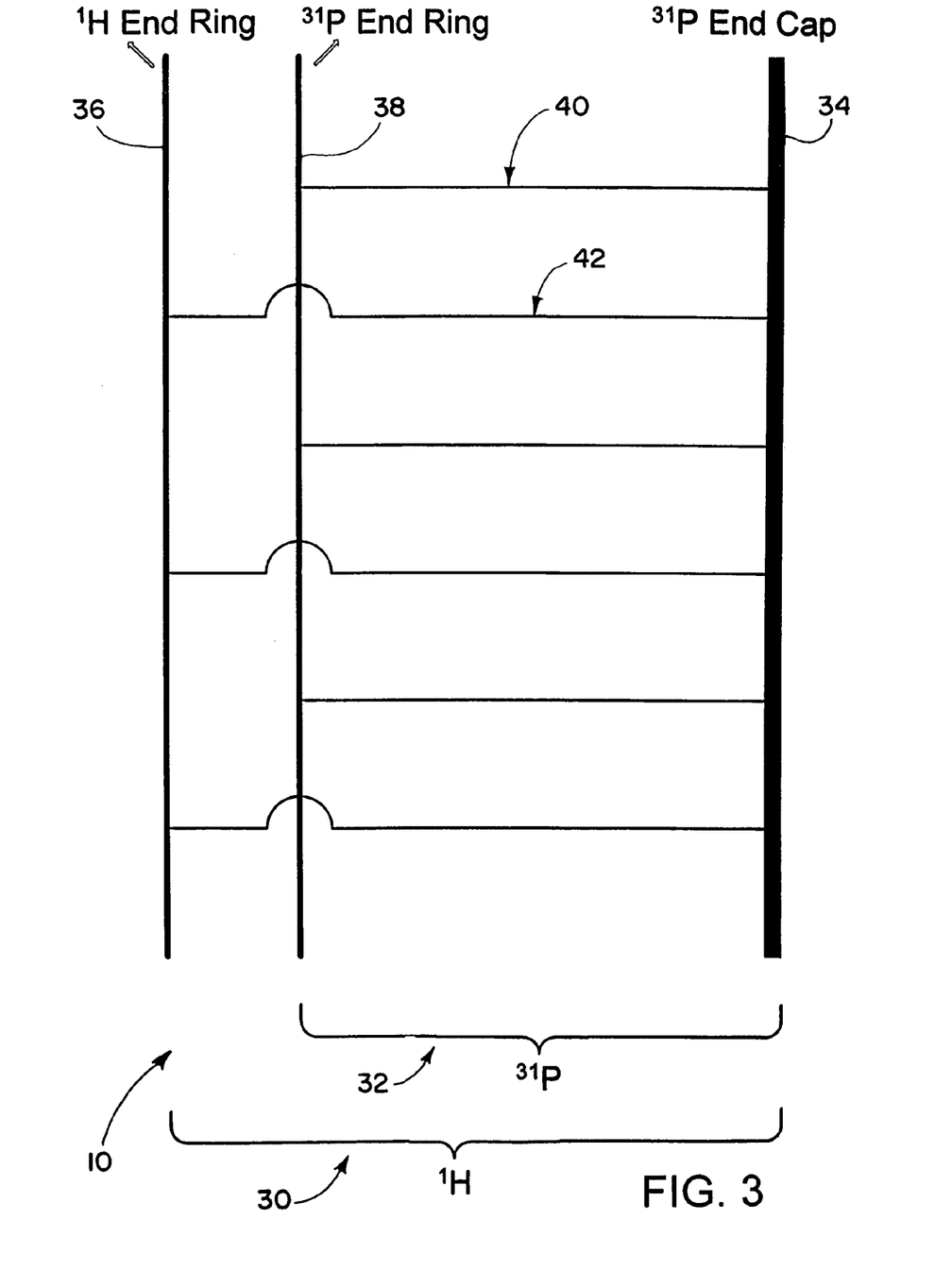
FIG. 3 is a schematic view of the dual-tune coil of FIG. 2.

A simple planar representation of the coil of FIG. 2 is shown in FIG. 3. The coil 10 includes two coils 30, 32, having a common connection at an end cap 34. The end cap 34 serves as an RF mirror to provide a more homogenous B field. The coil 10 has two end rings 36, 38, one for phosphorus ($^{31}$P) and one for proton ($^1$H), and several legs 40, 42 that originate on the end rings 36, 38 and terminate on the common end cap 34. The legs 40, 42 of the two coils 30, 32 are interleaved to present identical homogeneous B field distributions inside the coil volume. The end cap 34 is made of a solid copper sheet that is broken in to smaller pieces. The smaller pieces are connected by high value RF shorting capacitors, which break the gradient induced eddy currents. The two end rings 36, 38 are not directly electrically connected but have magnetic coupling through space. Likewise, the two coils 30, 32 are not interconnected directly, but are connected by the common end-cap 34, which serves as a common ground. The coverage for the $^1$H is slightly longer than for the $^{31}$P for imaging and shimming a larger volume.

Two embodiments are presented, a low-pass low-pass configuration for operation at 1.5 Tesla (T) and a high-pass low-pass configuration for operation at 3 T. Coil diameter is 11.5" and overall length is 8.5", for example. The coils have a total of 24 legs, 12 for each NMR frequency.

Figure 4:
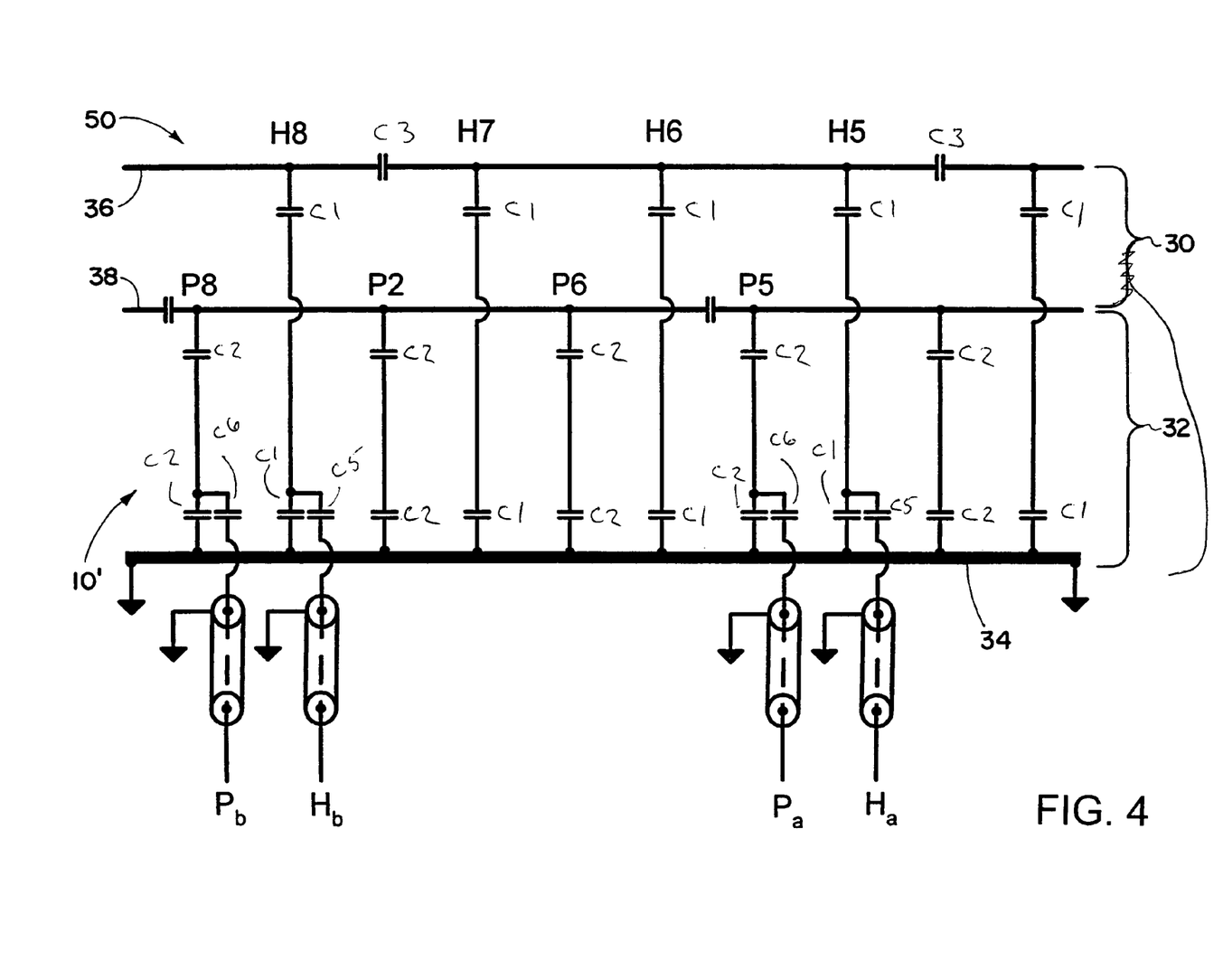
FIG. 4 is a schematic view of a low-pass low-pass configuration of a dual-tune coil in accordance with an embodiment of the present invention.

A section of a low-pass low-pass coil 10' is shown in FIG. 4. C1 capacitors and C2 capacitors are used to resonate $^1$H and $^{31}$P close to the NMR frequencies. Since phosphorous is roughly 2.5 times lower than the proton frequency, roughly 6.25 times of the capacitance is required to tune phosphorous. C3 and C4 value capacitors are used to break the solid $^1$H and $^{31}$P end rings 36, 38 to reduce gradient induced eddy currents. The principal modes of the coil 10' at both NMR frequencies are matched to 50 ohms using un-balanced capacitive matching with C5 and C6 across capacitors C1 and C2 on legs H5 & H8 and P5 & P8 ($P_a$, $P_b$, $H_a$, $H_b$) respectively. The grounds of the coaxial cables (not shown) exiting the coil are shorted to the end cap 34 to eliminate cable resonances. It is noted that in all embodiments, electronic components, e.g., capacitors, inductors, filter networks, etc., can be located behind the end cap of the coil. Placing the electronic components behind the end cap and outside the coil volume, thus minimizing the likelihood of interference between the electronic components and the coil.

Figure 5:
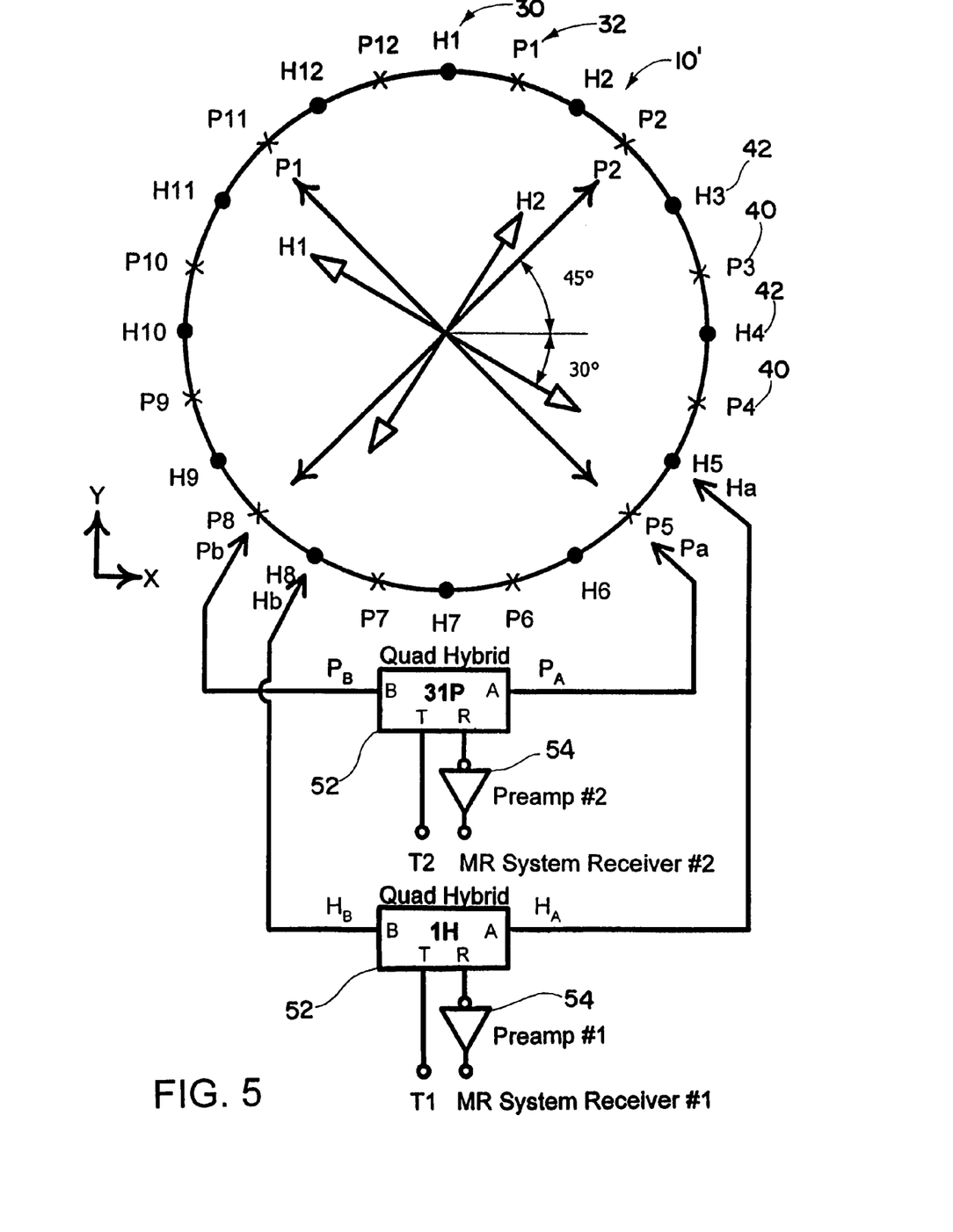
FIG. 5 is cross sectional view of the dual-tune coil of FIG. 4 illustrating the mode alignment for the principle modes and the physical orientation of the drives.

Mode alignment for the principal modes, physical orientation of the drives along with a cross-sectional view of the coil 10' are shown in FIG. 5. As seen from FIG. 5, the proton and phosphorous legs 40, 42 of the coils 30, 32 are interleaved to minimize their coupling and to provide near identical homogeneous B field distributions inside the coil volume. Principal phosphorous modes are driven at ±45 degrees, whereas principal proton modes are driven at 30 degrees and −60 degrees to the vertical axis, respectively. Capacitive or inductive matching or a combination thereof may be used to transform the impedances across the tuning capacitors (C1, C2 of FIG. 4) to 50 ohms.

The 50 ohm matched outputs $P_a$, $P_b$, $H_a$, $H_b$ then are combined using a quadrature hybrid coupler 52 (−3 dB power splitter/combiner, 0 & 90 degree phase shifter). The quadrature coupler 52 has four ports (T, R, A & B). Transmitter power incident on the hybrid on the T port is split in half and separated by 90 degrees at terminals A & B ($P_A$ & $P_B$, $H_A$ & $H_B$) that reach the coil 10'. Low level NMR signals picked by the principal linear modes of the coil (P1 & P2, H1 & H2) are matched to 50 ohms (at $P_A$ & $P_B$, $H_A$ & $H_B$) and combined using the same quadrature hybrids 52 to form single outputs R that are fed to the MR system receivers (#1, #2, not shown) via respective preamplifiers 54.

Should the linear modes of the coil be balanced (that is, should the principal modes of the coil see the same load, and hence realize identical quality factor (Q) values), then the transmitter power will be reduced by one-half and the combined S/N will be 40% greater than the linear mode alone. Thus, the incident power is reduced and the S/N is enhanced. Since the legs 40, 42 that are evenly spread around the azimuth carry sinusoidal currents, homogeneous B fields are realized over the imaging FOV (inside the coil volume).

Figure 6:
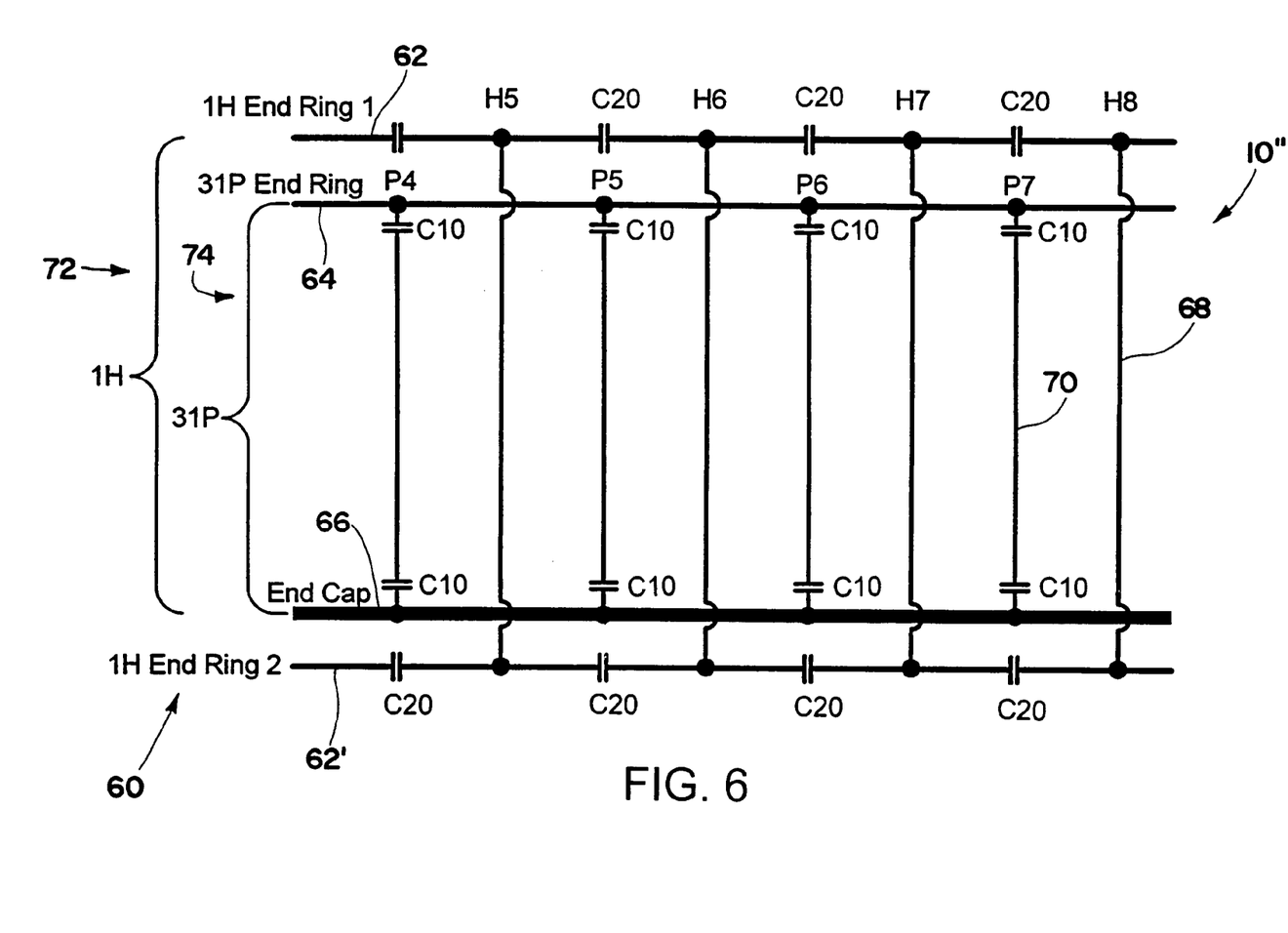
FIG. 6 is a schematic view of a high-pass low-pass dual tune coil in accordance with another embodiment of the present invention.

A section of a high-pass low-pass coil 10" is shown in FIG. 6. C10 capacitors and C20 capacitors are used to resonate the $^{31}$P and $^1$H close to the NMR frequencies. A high pass design is chosen for $^1$H because of the high operating frequency (128 MHz) for the large volume head coil of FIG. 2. At higher frequencies, the large sized resonator approaches self resonance very close to or near the NMR frequency. When this occurs, the phase shifts in the individual sections are dominated by the physical structure rather than due to the tuning capacitors. The coil 10" becomes more of a radiating antenna where E fields are sought rather than an NMR coil, where uniform high B field intensities are sought inside the coil volume. It is realized that E fields exist inside the coil volume. The distributed volume design of the present invention supports the reduction of E fields and their coupling to the human body. This feature is especially useful at higher frequencies (128 MHz and above) where the human body is a very lossy reactive (resistive and capacitive) sample.

Therefore, it is necessary to break the coil into smaller sections whose self resonances are much greater than the NMR operating frequency. Here, appropriate phase shifts based on the number of sections in the coil and their location will exhibit sinusoidal current distributions in the coil periphery, which will result in a homogenous B field distribution inside the coil volume. A high pass design minimizes the inductance of the end rings 62, 62', 64 and hence the self resonance of the coil structure. The electric fields are concentrated on the capacitors C20 located on the end rings, but since their values are moderate (between 20–200 pF), the voltages will be moderate to low (V=iXc, Xc=1/ωC) at higher frequencies. Note, one $^1$H end ring 62' is past the end cap 66. This is useful to double the tuning capacitance for $^1$H (and hence reduce the voltages across them by half) and is used to facilitate coupling to the coil 10" past the end cap 66 without coil interferences.

Since phosphorous is resonant at a frequency that is 2.5 times lower than proton, (e.g., about 52 MHz), a low-pass configuration is sufficient for optimum phosphorous performance. The $^{31}$P end ring 64 is broken with high value RF shorting capacitors (not shown) to reduce gradient induced eddy currents.

Figure 7A:
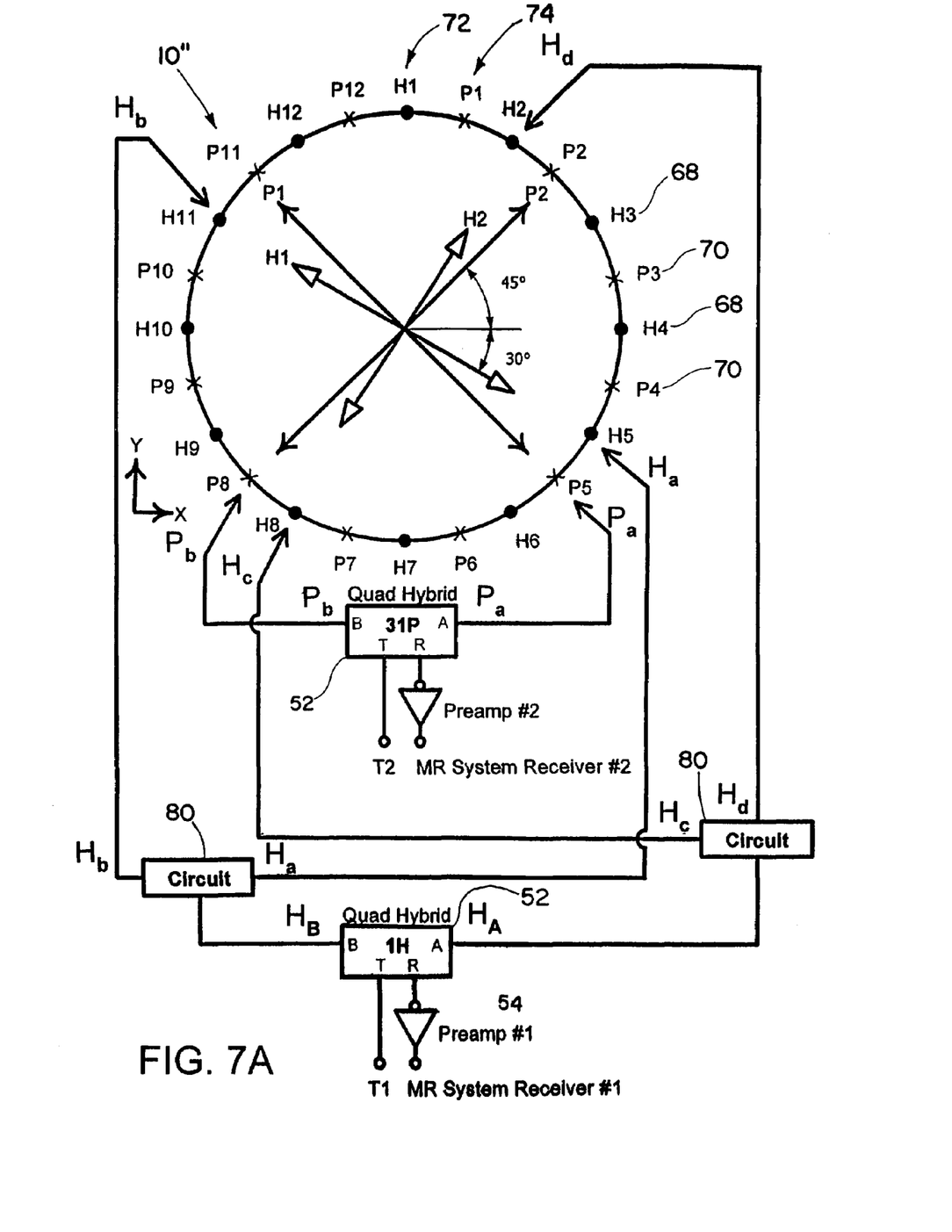
FIG. 7A is a cross sectional view of the high-pass low-pass dual tune coil of FIG. 6 illustrating the mode alignment for the principle modes and the physical orientation of the drives.

Mode alignment for the principal modes, physical orientation of the drives along with a cross-sectional view of the coil 10" are shown in FIG. 7A. As seen in FIG. 7A, the proton and phosphorous legs 68, 70 of the coils 72, 74 are interleaved to minimize their coupling and to provide near identical homogeneous B field distributions inside the coil volume. Principal phosphorous modes are driven across capacitors C10 (on legs P5 & P8) at ±45 degrees with respect to the vertical axis ($P_a$, $P_b$). Capacitive or inductive matching or a combination thereof may be used to transform the impedances across the tuning capacitors (C10, C20) to 50 ohms.

Principal proton modes are driven between two coil sections on the legs common to the neighboring sections (H5 & H11, H2 & H8) in a symmetrical fashion ($H_a$ & $H_b$, $H_c$ &

$H_d$). Drive points located symmetrically opposite are combined using a push-pull circuit 80 (±90 degree phase shifter). The push-pull circuit 80 helps to maintain a 180 degree phase shift across H5 & H11 (and between H2 & H8) and helps to transform the impedance from 200 ohms across H5 & H11 to 50 ohms at $H_B$.

Figure 7B:
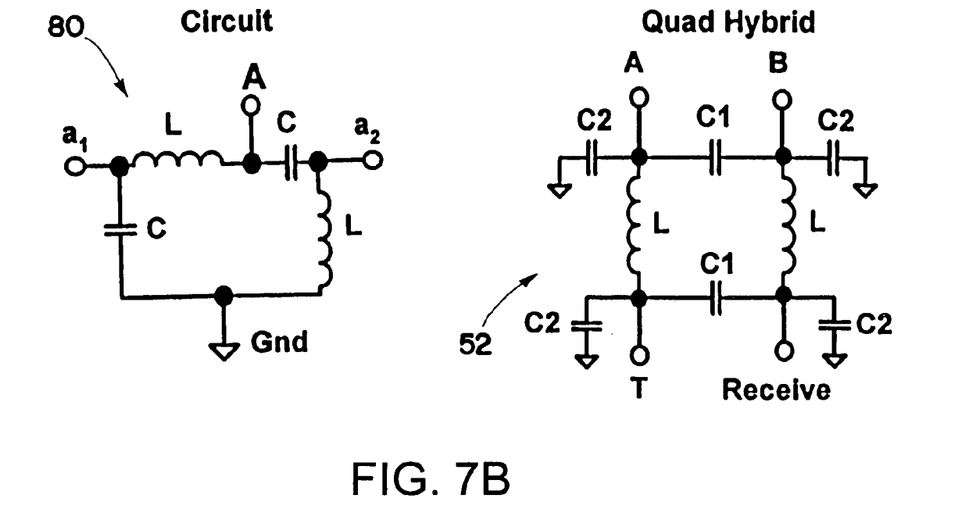
FIG. 7B is a schematic diagram of a push-pull circuit used to combine drive points in accordance with an embodiment of the present invention.

Details of the push-pull circuit 80 are shown in FIG. 7B. L & C values are computed based on the operating frequency. The low-pass and high-pass sections of the circuit lead and lag in phase with respect to the output (a1, a2 with respect to A).

The 50 ohm matched outputs $P_a$, $P_b$, $H_a$, $H_b$ then are combined and interfaced to the MR system transmitters and receivers (not shown) similar to that described for the low-pass low-pass configuration of FIG. 5. A schematic of a quadrature hybrid 52 is shown in FIG. 7B. Values for a 3 T–3 dB quadrature combiner are as follows: C1=25 pF, C2=11 pF, L=44 nH.

Figure 8:
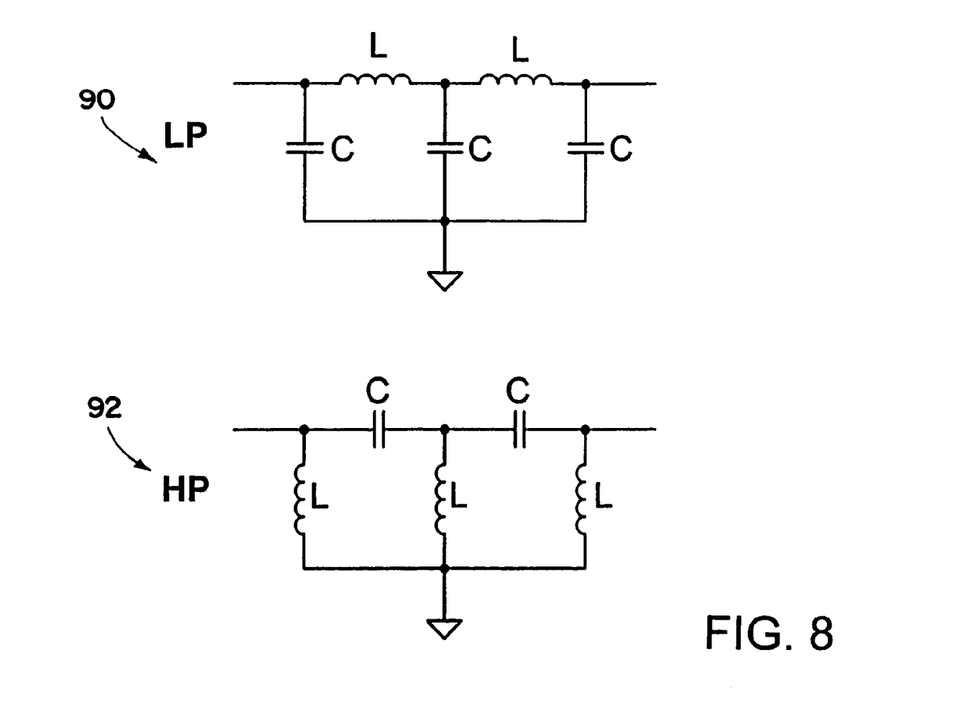
FIG. 8 is a schematic diagram of a two-stage Chebyshev filter utilized to provide additional electrical decoupling between an inner coil and an outer coil of the dual-tune RF coil of the present invention.

For both configurations (low-pass low-pass of FIGS. 4 & 5 and high-pass low-pass of FIGS. 6 & 7A), inter-frequency mutual coupling is mandated by the coil design. Referring to FIG. 8, additional electrical decoupling can be accomplished by inserting 2 stage Chebyshev RF filters 90, 92 between the 50 ohm matched outputs and the respective quadrature hybrids 52. Filter values for operation at 3 T are as follows: Low-Pass C1=25 pF, C2=50 pF, L=62 nH; High Pass C=25 pF, L1=62 nH, L2=31 nH.

Figure 9:
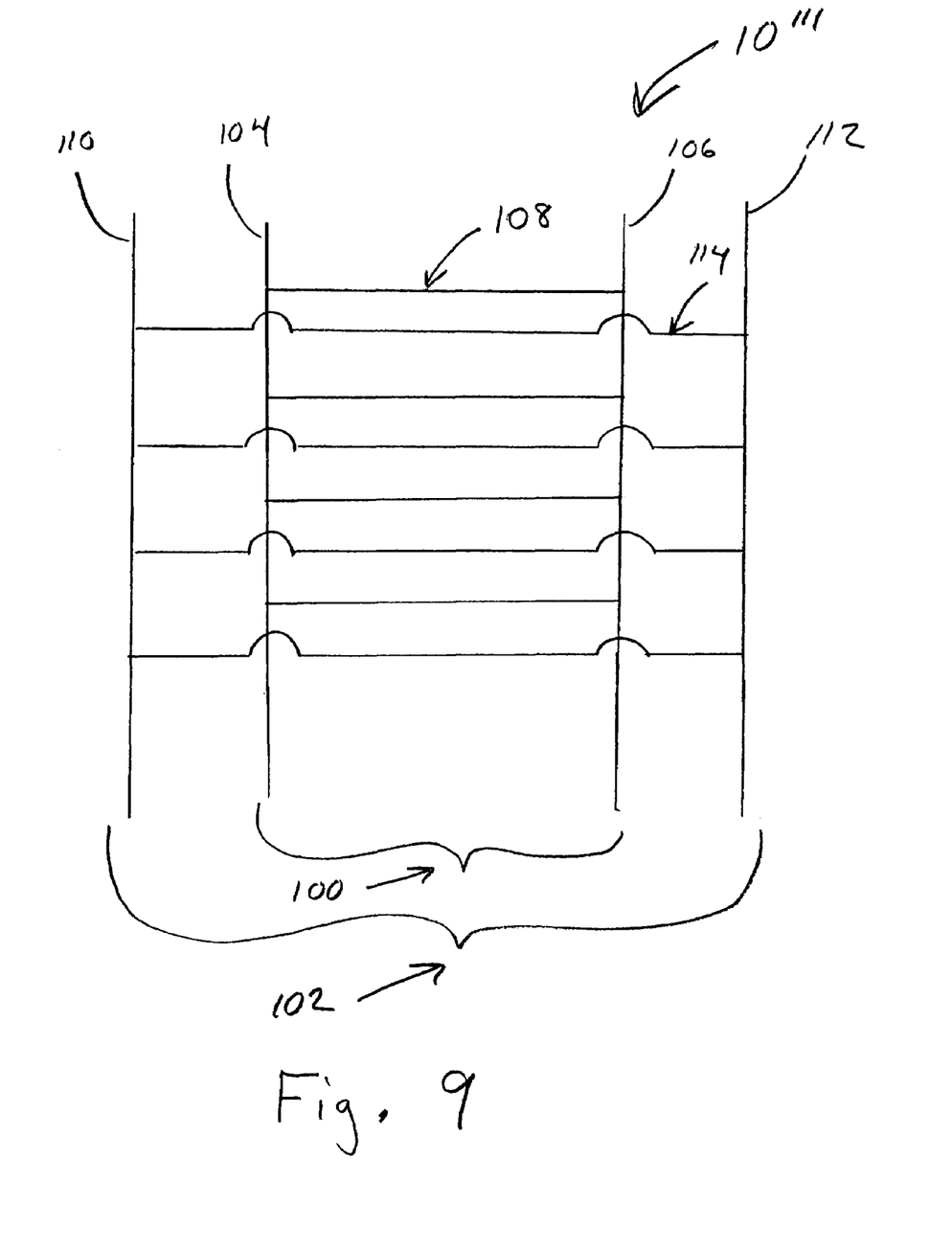
FIG. 9 is a schematic view of a dual-tune coil in accordance with another embodiment of the present invention.

Referring to FIG. 9, a simple planar representation of another embodiment of a dual-tune coil 10′′′ in accordance with the present invention is illustrated. The coil 10′′′ can be used, for example, to image calf muscles in humans or for imaging animals in high field NMR studies. The dual-tune coil 10′′′ includes two birdcage coils 100, 102 in a lapped configuration. The first coil 100 has a first end ring 104 and a second end ring 106. Several legs 108 originate on the first end ring 104 and terminate on the second end ring 106. The second coil 102 also has a first end ring 110 and a second end ring 112. Several legs 114 originate from the first end ring 110 and terminate in the second end ring 112. The end rings 110, 112 of the second coil are not electrically coupled to the end rings 104, 106 of the first coil. However, the end rings 110, 112 are magnetically coupled to the end rings 104, 106 through space. The legs 108, 114 of each coil 100, 102 are interleaved to present identical homogenous B field distributions inside the coil volume. Both high pass and loss pass versions of the dual-tune coil 10′′′ can be implemented as was described previously.

Figure 10:
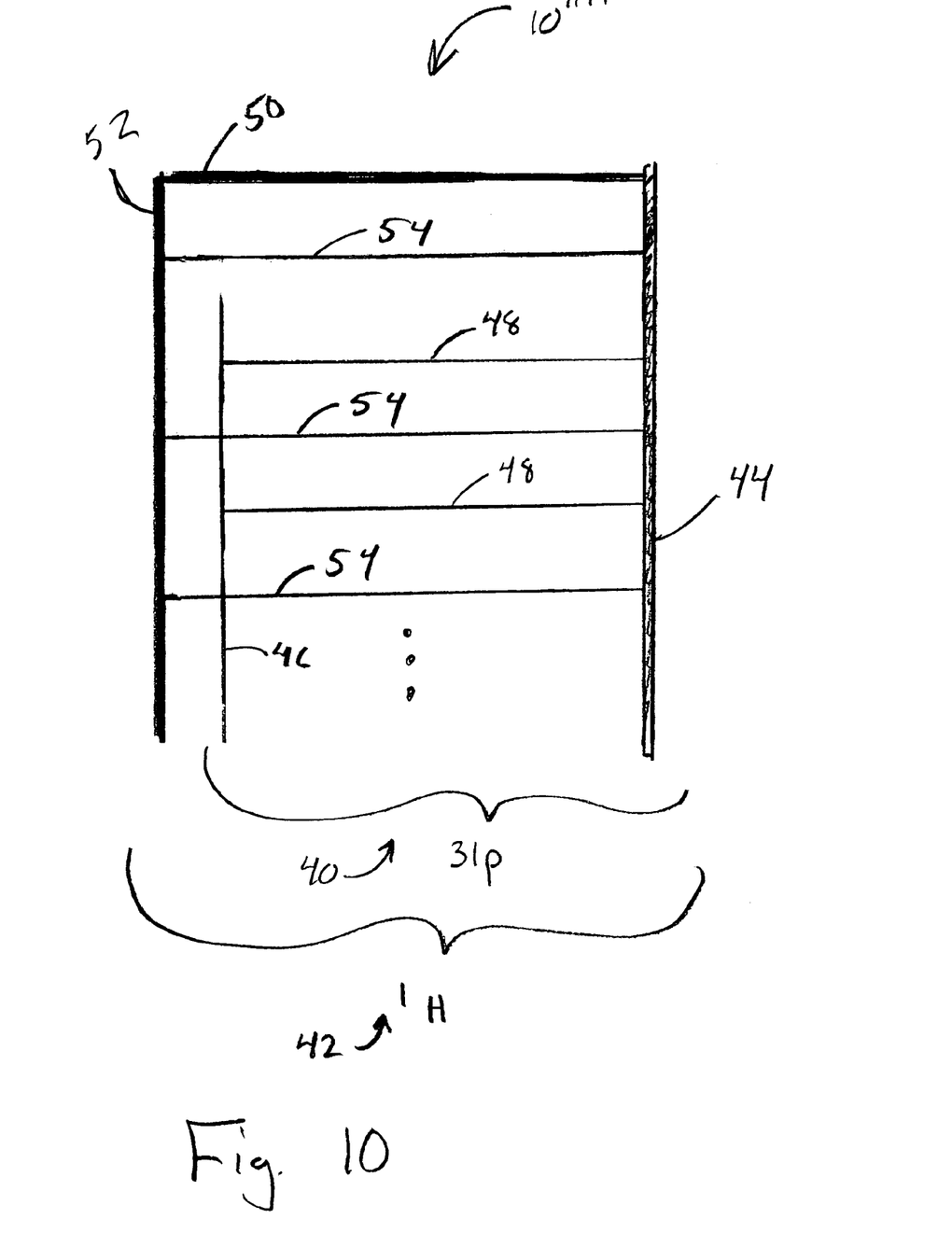
FIG. 10 is a schematic view of a dual-tune coil in accordance with another embodiment of the present invention.

Referring to FIG. 10, a simple planar representation of another embodiment of a dual-tune coil 10′′′′ in accordance with the present invention is illustrated. The coil 10′′′′ includes a first birdcage coil 40 and a cavity resonator 42, both having a common connection at an end cap 44. Cavity resonators are well known in the art and will not be discussed herein. Further information relating to cavity resonators can be found in U.S. Pat. No. 4,751,464, the entire disclosure of which is hereby incorporated by reference.

The first birdcage coil 40 includes an end ring 46 having a generally annular opening and several legs 48, which originate on the end ring 46 and terminate on the end cap 44. The cavity resonator 42 includes an outer cylinder 50, which operates as an RF shield A radially extending band 52, which also operates as an RF shield, connects one end of the outer cylinder 50 to one end of a series of legs 54, and the end cap 44 connects the other end of the outer cylinder and the other end of the series of legs 54. A cavity (not shown) is formed between the outer cylinder 50, the legs 54, the end cap 44 and the band 52.

The legs 48, 54 of the birdcage 40 and the cavity resonator 42 are interleaved to present identical homogeneous B field distributions inside the coil volume. The end cap 44, as well as the outer cylinder 50 and band 52, are made of a solid copper sheet that is broken in to smaller pieces. The smaller pieces are connected by high value RF shorting capacitors, which break the gradient induced eddy currents. The birdcage coil 40 and the cavity resonator 42 are not interconnected directly, but are connected by the common end cap 44, which serves as a common ground. The birdcage coil 40 can be tuned for $^{31}P$ (lower frequency) and the cavity resonator 42 can be tuned for $^{1}H$ (higher frequency).

The art of combining two volume, quadrature coils in an interleaved manner with a minimal amount of coupling between the coils is presented herein. Also presented is simultaneous operation of the coil in MRI and MRS applications. The coil design allows proton decoupled phosphorous examination of the patient in one clinical setting, obviating the need to change RF coils and re-position the patient. Thus, two studies (MRI, MRS) can be carried out in one patient setting. The dual frequency coil presented here will assist to integrate MR imaging with spectroscopy and can be useful in the diagnosis/prognosis of complex illnesses. Prompt diagnosis/prognosis of complex illnesses may lead to prompt clinical interventions, which in turn may save lives.

While particular embodiments of the invention have been described in detail, it is understood that the invention is not limited correspondingly in scope, but includes all changes, modifications and equivalents coming within the spirit and terms of the claims appended hereto. For example, different coil designs, e.g., birdcage, saddle, solenoid, cavity resonator, etc., may be combined into one structure for operation at one or more NMR frequencies. Additionally, different volume coils and/or different surface coils can be combined into one structure for operation at one or more NMR frequencies. Further, the coil can be driven in a two port or four port feed as described for FIGS. 5 and 7A at one or more NMR frequencies. Even further, additional Chebyshev RF filters can be utilized to further increase the electrical isolation between coils at one or more NMR frequencies.

What is claimed is:

1. A multi-tune radio frequency (RF) coil, comprising:
a first RF coil, comprising:
a first end ring having a generally annular opening; and
a first plurality of elongated segments coupled to and positioned circumferentially around the first end ring, wherein the first plurality of elongated segments are azimuthally offset from one another by a substantially equal angular distance;
a second RF coil, comprising:
a second end ring having a generally annular opening;
a second plurality of elongated segments coupled to and positioned circumferentially around the second end ring, wherein the second plurality of elongated segments are azimuthally offset from one another by a substantially equal angular distance; and
at least one of a third end ring having a generally annular opening and an end cap, wherein the first and second plurality of elongated segments are coupled to and positioned circumferentially around the at least one of the end cap and the third end ring, thereby forming a coil volume, and the first and second plurality of elongated segments lie in a same circumferential plane.

2. The coil of claim 1, wherein the end cap comprises a plurality of copper sheets, and the plurality of copper sheets are interconnected via a plurality of shorting capacitors.

3. The coil of claim 1, further comprising at least one electronic component, wherein the at least one electronic component is located behind the end cap and outside the coil volume.

4. The coil of claim 1, wherein the first RF coil and the second RF coil are in a low pass configuration.

5. The coil of claim 1, wherein the first RF coil is in a high pass configuration and the second RF coil is in a low pass configuration.

6. The coil of claim 5, further comprising a phase shifter coupled to a plurality of drive points that are symmetrically opposite from one another.

7. The coil of claim 6, wherein the phase shifter comprises an LC circuit.

8. The coil of claim 1, wherein the first RF coil and the second RF coil are volume type coils.

9. The coil of claim 1, wherein the first RF coil is driven at a principle mode of ±45 degrees to a vertical axis and the second RF coil is driven at a principle mode of 30 degrees and −60 degrees to a vertical axis.

10. The coil of claim 8, wherein the first RF coil is a phosphorus coil and the second RF coil is a proton coil.

11. The coil of claim 8, wherein the principle modes are impedance matched at a nuclear magnetic resonant (NMR) frequency.

12. The coil of claim 11, wherein the principle modes are matched using capacitive matching.

13. The coil of claim 11, wherein the principle modes are matched using inductive matching.

14. The coil of claim 11, wherein the principle modes are matched using capacitive matching and inductive matching.

15. The coil of claim 11, wherein the principle modes are matched to about 50 ohms.

16. The coil of claim 11, wherein the matched outputs are combined using a quadrature hybrid coupler.

17. The coil of claim 1, further comprising an RF filter to reduce electrical coupling between the first RF coil and the second RF coil.

18. The coil of claim 17, wherein the RF filter is a two stage Chebyshev filter.

19. The coil of claim 1, wherein the first end ring and the second end ring are magnetically coupled.

20. The coil of claim 1, further comprising a platform, wherein the coil is operatively coupled to the platform to facilitate positioning of the coil relative to an object on the platform.

21. The multi-tune coil of claim 1, wherein the coil is tuned for concurrent magnetic resonance imaging (MRI) and magnetic resonance spectroscopy (MRS).

22. A system comprising the coil of claim 1, and further comprising a means for driving the coil during magnetic resonance scanning.

23. A magnetic resonance scanning system, comprising:
a multi-tune coil as recited in claim 1; and
means for processing RF signals which are at least one of received from the multi-tune coil and transmitted from the RF coil in order to obtain a magnetic resonance scan.

24. A multi-tune radio frequency (RF) coil for concurrent magnetic resonance imaging (MRI) and magnetic resonance spectroscopy (MRS), comprising:
a first RF coil, comprising:
a first end ring having a generally annular opening;
a second end ring having a generally annular opening; and
a first plurality of elongated segments coupled to and positioned circumferentially around the first end ring and the second end ring, thereby forming a coil volume, wherein the first plurality of elongated segments are azimuthally offset from one another by a substantially equal angular distance; and
a second RF coil, comprising:
a third end ring having a generally annular opening;
a fourth end ring having a generally annular opening; and
a second plurality of elongated segments coupled to and positioned circumferentially around the third end ring and the fourth end ring, thereby forming a coil volume, wherein the second plurality of elongated segments are azimuthally offset from one another by a substantially equal angular distance, and wherein the first and second plurality of elongated segments lie in a same circumferential plane.

25. A multi-tune radio frequency (RF) coil, comprising:
a first RF coil, comprising:
a first end ring having a generally annular opening; and
a first plurality of elongated segments coupled to and positioned circumferentially around the first end ring, wherein the first plurality of elongated segments are azimuthally offset from one another by a substantially equal angular distance;
a second RF coil, comprising:
a first cylinder formed by a second plurality of elongated segments, wherein the second plurality of elongated segments are azimuthally offset from one another by a substantially equal angular distance;
a second cylinder, wherein the first cylinder is within the second cylinder; and
an end cap, wherein the first and second plurality of elongated segments are coupled to and positioned circumferentially around the end cap, thereby forming a coil volume, and the first and second plurality of elongated segments lie in a same circumferential plane.

26. The multi-tune coil of claim 25, wherein the first RF coil is birdcage coil and the second RF coil is a cavity resonator.

27. The multi-tune coil of claim 26, wherein a tuning frequency of the cavity resonator is greater than a tuning frequency of the birdcage coil.

* * * * *